United States Patent
Suzuki et al.

(10) Patent No.: US 7,125,811 B2
(45) Date of Patent: Oct. 24, 2006

(54) OXIDATION METHOD FOR SEMICONDUCTOR PROCESS

(75) Inventors: Keisuke Suzuki, Tokyo (JP); Toshiyuki Ikeuchi, Tokyo (JP); Kazuhide Hasebe, Tokyo (JP)

(73) Assignee: Tokyo Electron Limited, Tokyo (JP)

(*) Notice: Subject to any disclaimer, the term of this patent is extended or adjusted under 35 U.S.C. 154(b) by 114 days.

(21) Appl. No.: 10/924,853

(22) Filed: Aug. 25, 2004

(65) Prior Publication Data

US 2005/0079699 A1    Apr. 14, 2005

(30) Foreign Application Priority Data

Aug. 29, 2003 (JP) .............................. 2003-306745

(51) Int. Cl.
*H01L 21/31* (2006.01)

(52) U.S. Cl. .................. 438/773; 438/762; 438/765; 438/766; 438/769; 438/770

(58) Field of Classification Search .............. 438/765, 438/766, 769, 770, 762, 773
See application file for complete search history.

(56) References Cited

U.S. PATENT DOCUMENTS

| | | | |
|---|---|---|---|
| 2003/0162372 A1* | 8/2003 | Yoo | 438/484 |
| 2003/0207556 A1* | 11/2003 | Weimer et al. | 438/592 |
| 2003/0224618 A1* | 12/2003 | Sato et al. | 438/770 |
| 2004/0147136 A1* | 7/2004 | Chen et al. | 438/778 |
| 2004/0166632 A1* | 8/2004 | Jeng et al. | 438/261 |

FOREIGN PATENT DOCUMENTS

| | | |
|---|---|---|
| JP | 57-1232 | 1/1982 |
| JP | 3-140453 | 6/1991 |
| JP | 11-330468 | 11/1999 |
| JP | 2001-527279 | 12/2001 |
| JP | 2002-176052 | 6/2002 |

* cited by examiner

Primary Examiner—George R. Fourson
Assistant Examiner—Thanh V. Pham
(74) Attorney, Agent, or Firm—Oblon, Spivak, McClelland, Maier & Neustadt, P.C.

(57) ABSTRACT

An oxidation method for a semiconductor process, which oxidizes a surface of a target substrate, includes heating a process container that accommodates the target substrate, and supplying hydrogen gas and oxygen gas into the process container while exhausting the process container. The oxidation method also includes causing the hydrogen gas and the oxygen gas to react with each other in the process container at a process temperature and a process pressure to generate water vapor, and oxidizing the surface of the target substrate by the water vapor. The process pressure is set at 2000 Pa (15 Torr) or more.

11 Claims, 9 Drawing Sheets

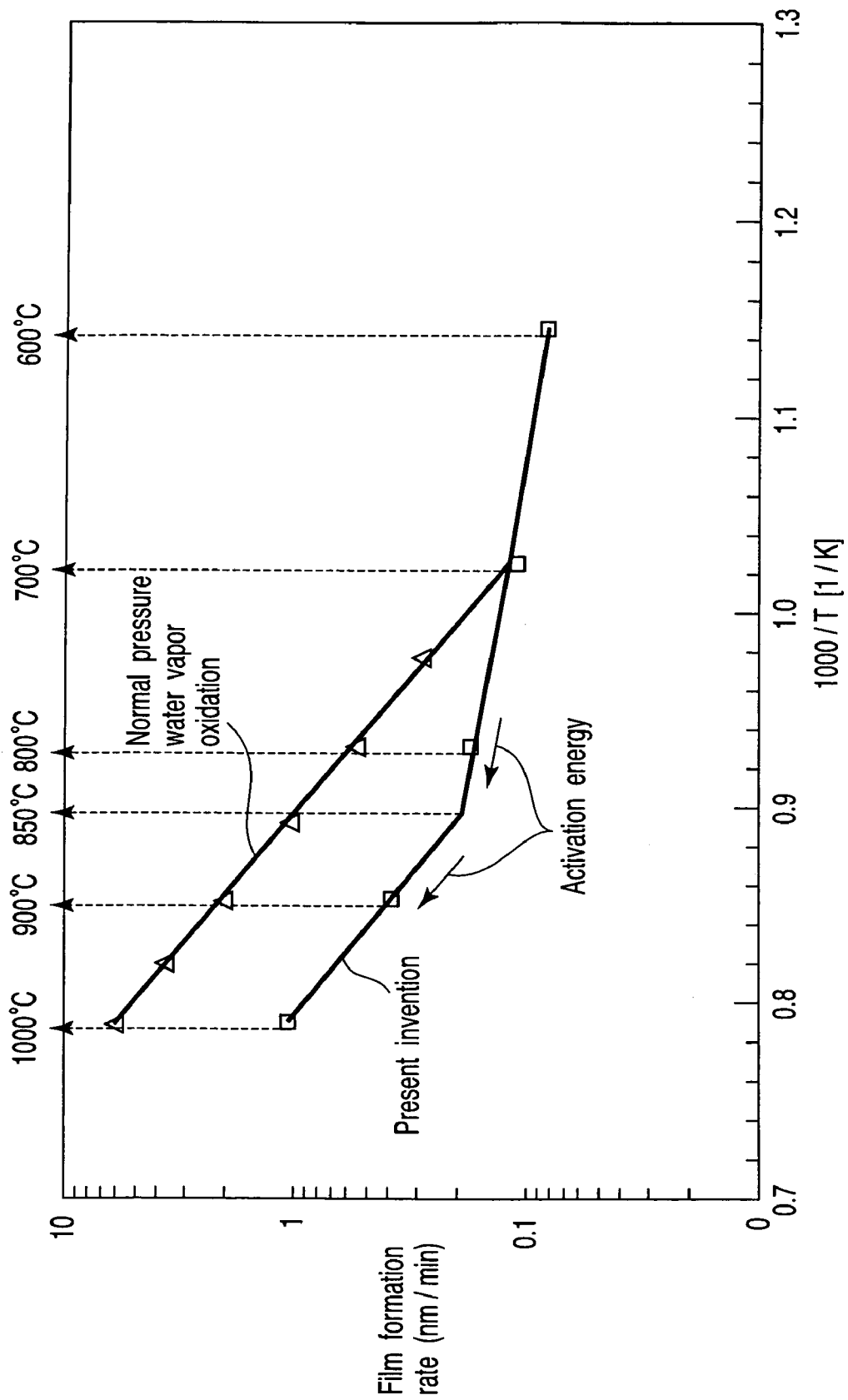
F I G. 4

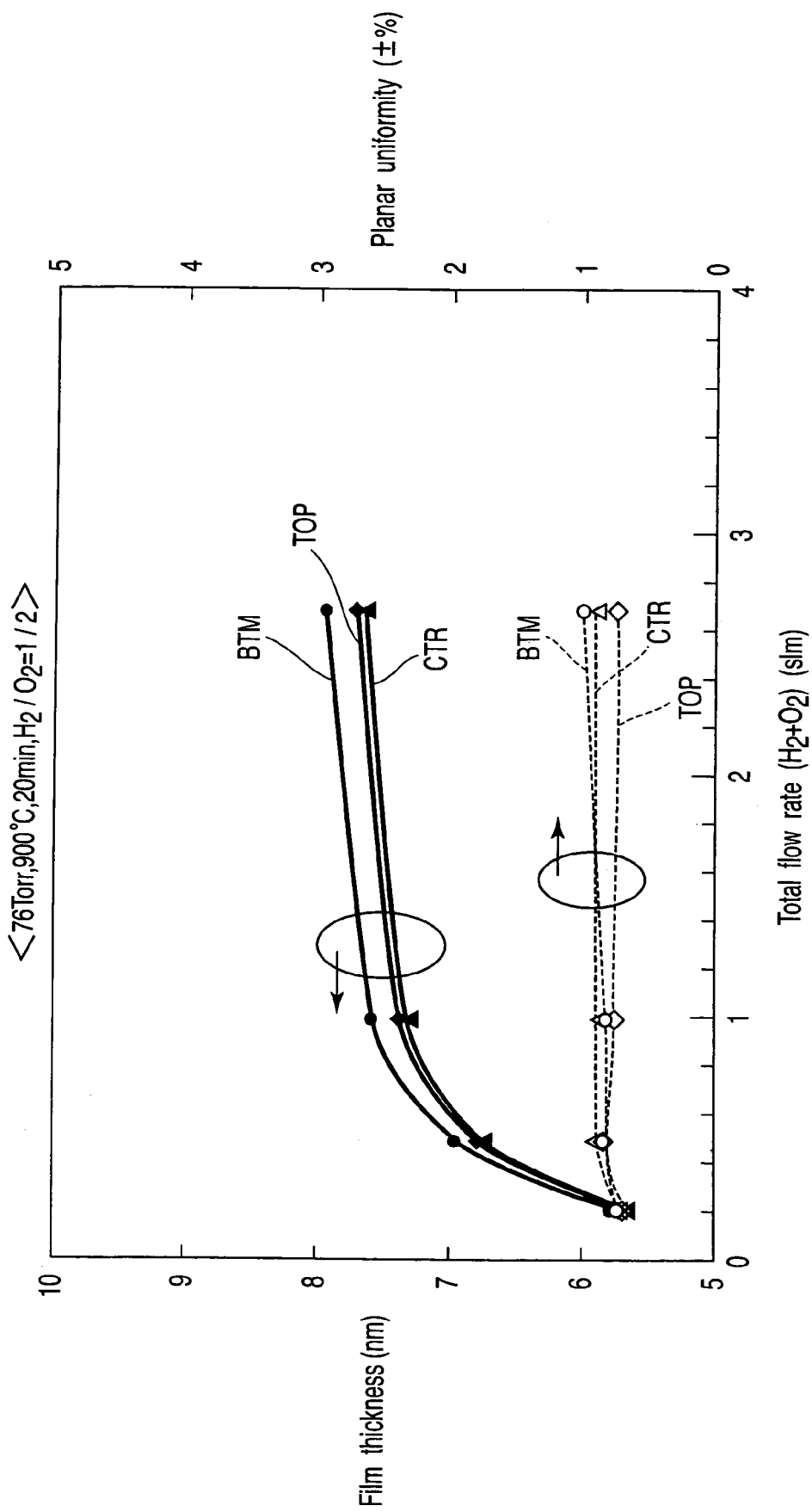
F I G. 5

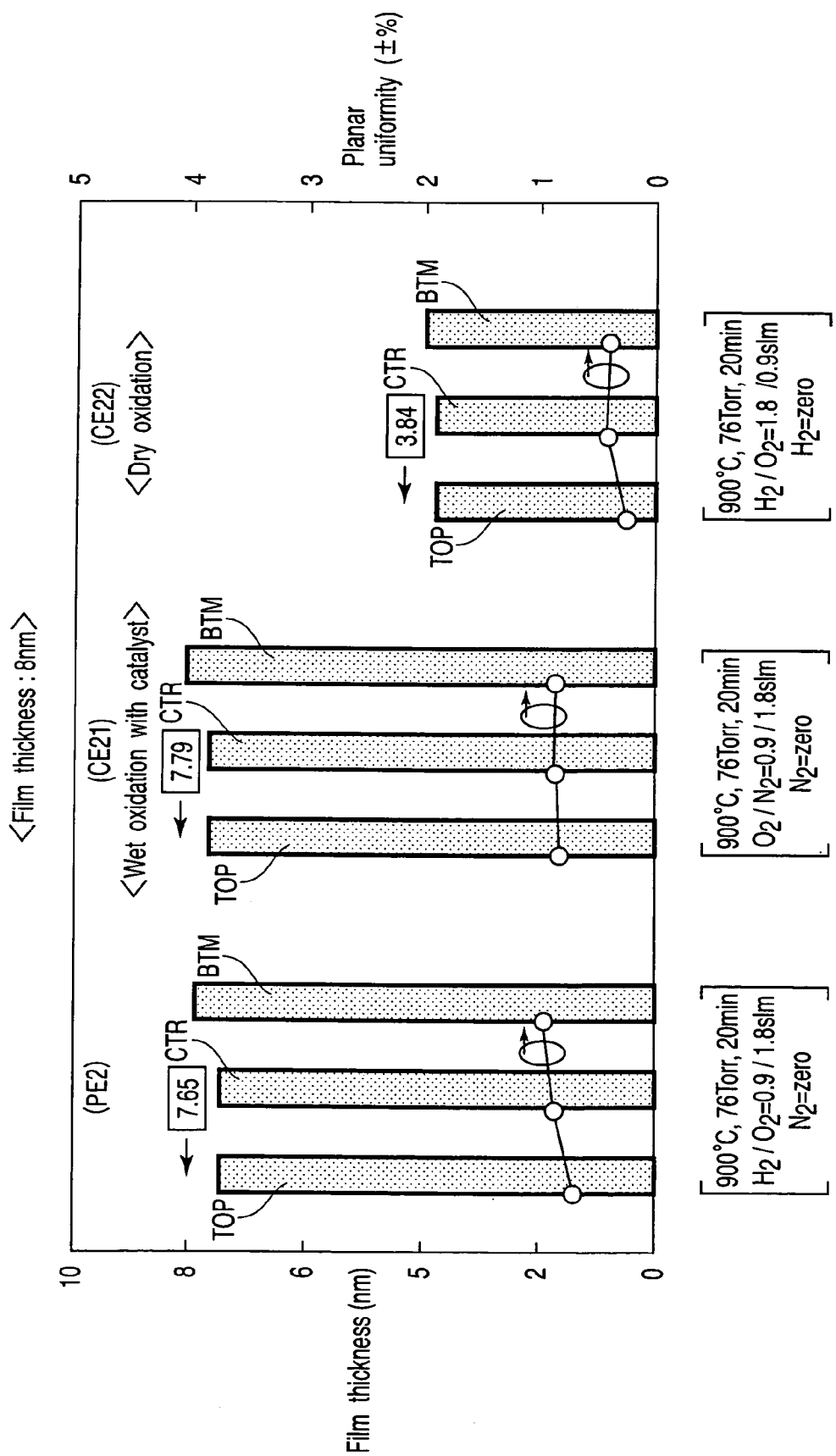
F I G. 9

OXIDATION METHOD FOR SEMICONDUCTOR PROCESS

CROSS-REFERENCE TO RELATED APPLICATIONS

This application is based upon and claims the benefit of priority from prior Japanese Patent Application No. 2003-306745, filed Aug. 29, 2003, the entire contents of which are incorporated herein by reference.

BACKGROUND OF THE INVENTION

1. Field of the Invention

The present invention relates to an oxidation method for a semiconductor process, which thermally oxidizes the surface of a target substrate by water vapor. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor integrated circuits, a semiconductor substrate, such as a silicon wafer, is subjected to various processes, such as film-formation, etching, oxidation, diffusion, and reformation, in general. For example, oxidation includes oxidation of the surface of a monocrystalline silicon film, and oxidation of a metal film. Particularly, a silicon oxide film formed by oxidation is applied to a device isolation film, gate oxide film, capacitor insulating film, or the like.

A vacuum oxidation method for forming a thin film under a vacuum pressure is disclosed, for example, in Jpn. Pat. Appln. KOKAI Publication No. 57-1232 (patent publication 1), in which $H_2$ and $O_2$ are supplied into a vacuum furnace to perform hydrogen burning oxidation. Further, a wet oxidation method is disclosed, for example, in Jpn. Pat. Appln. KOKAI Publication No. 3-140453 (patent publication 2), in which hydrogen and oxygen are burned within an external combustion apparatus using plasma to generate water vapor, which is then used for oxidation.

Another wet oxidation method is disclosed, for example, in Jpn. Pat. Appln. KOKAI Publication No. 11-330468 (patent publication 3), in which hydrogen and oxygen are made to react with each other by a catalyst at a low temperature to generate water vapor, which is then supplied into a vacuum furnace. Furthermore, another oxidation method is disclosed, for example, in Jpn. Pat. Appln. KOHYO Publication No. 2001-527279 (patent publication 4) and Jpn. Pat. Appln. KOKAI Publication No. 2002-176052 (patent publication 5), in which hydrogen and oxygen are supplied into a vacuum furnace to generate activated species, which are used for oxidation.

BRIEF SUMMARY OF THE INVENTION

An object of the present invention is to provide an oxidation method, which can form a very thin oxide film with good quality.

According to a first aspect of the present invention, there is provided an oxidation method for a semiconductor process, which oxidizes a surface of a target substrate, the method comprising:

heating a process container that accommodates the target substrate;

supplying hydrogen gas and oxygen gas into the process container while exhausting the process container;

causing the hydrogen gas and the oxygen gas to react with each other in the process container at a process temperature and a process pressure to generate water vapor, the process pressure being set at 2000 Pa (15 Torr) or more; and oxidizing the surface of the target substrate by the water vapor.

According to a second aspect of the present invention, there is provided an oxidation method for oxidizing a silicon layer on a surface of a target substrate to form a silicon oxide film, the method comprising:

heating a process container that accommodates the target substrate;

supplying hydrogen gas and oxygen gas into the process container while exhausting the process container;

causing the hydrogen gas and the oxygen gas to react with each other in the process container at a process temperature and a process pressure to generate water vapor, the process temperature being set to be within a range of from 600 to 1000° C., and the process pressure being set to be within a range of from 2000 Pa (15 Torr) to 10130 Pa (76 Torr); and oxidizing the silicon layer by the water vapor to form the silicon oxide film.

In oxidation methods according to the first and second-aspects, when oxidation is performed while supplying hydrogen and oxygen into a process container, the process pressure is set to be higher than a certain value. Whereby, the oxidation species dedicated to oxidation changes from activated species of hydrogen and oxygen to water vapor. In this case, it is possible to form a thin film having a film thickness of, e.g., about 2 nm, with improved controllability in the film thickness. It is also possible to maintain good planar uniformity or inter-surface uniformity in the film thickness. Furthermore, a thin film can be formed by a very simple apparatus, without using a hydrogen burning apparatus of the catalyst type, which is conventionally required to form a thin film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a graph showing an Arrenius plot for obtaining activation energy from the result shown in FIG. 3;

FIG. 5 is a graph showing the relationship between the total gas flow rate of hydrogen and oxygen, and film thickness and planar uniformity in the film thickness, obtained by an experiment 3;

FIG. 9 is a graph showing the film thickness and planar uniformity of a present example PE2, and comparative examples CE21 and CE22, obtained by the experiment 6.

DETAILED DESCRIPTION OF THE INVENTION

Figure 1:
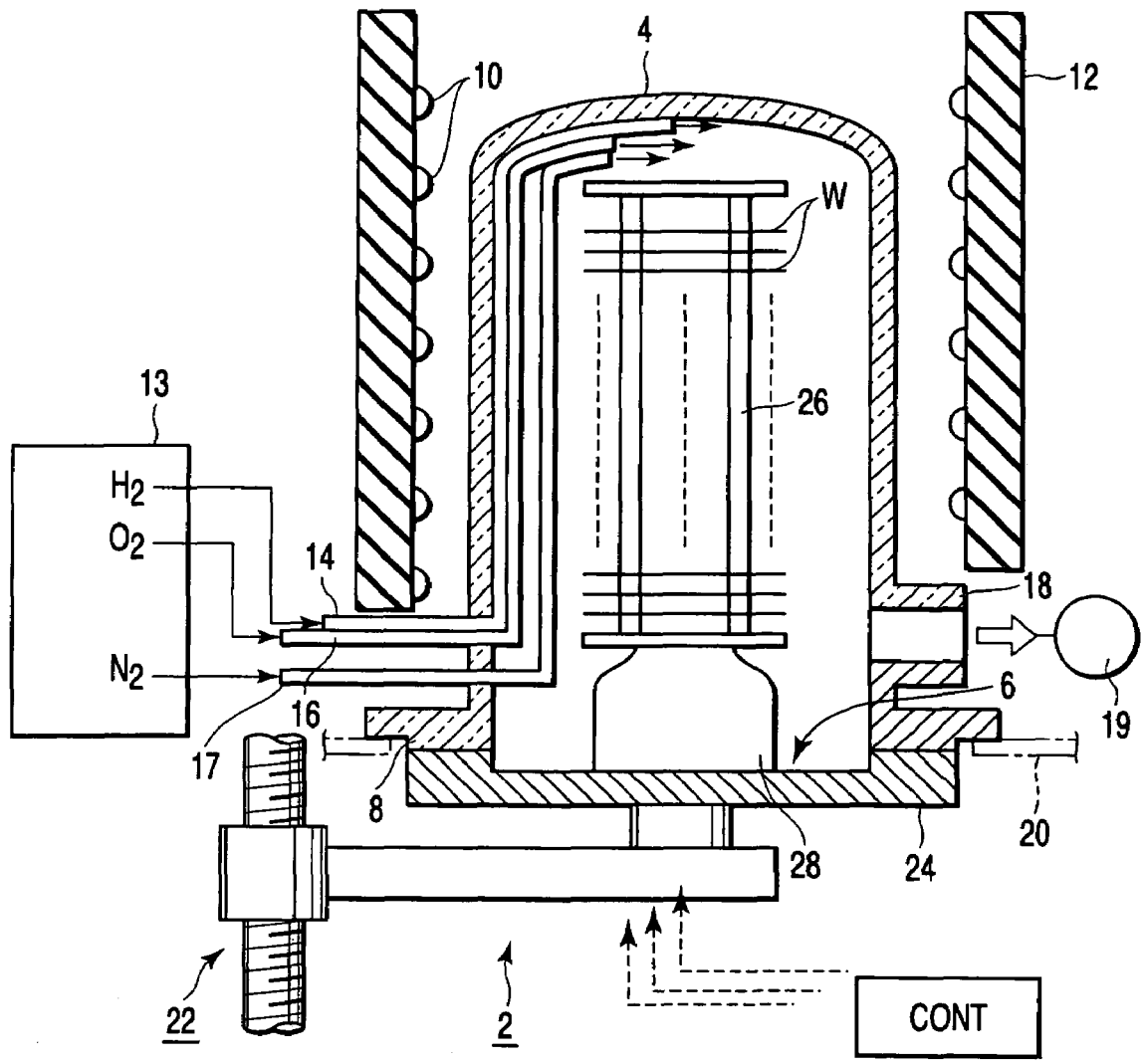
FIG. 1 is a sectional view schematically showing a vertical heat-processing apparatus according to an embodiment of the present invention.

In the process of developing the present invention, the inventors studied problems of conventional techniques for semiconductor processes, in relation to a method of forming an oxide film by thermal oxidation. As a result, the inventors have arrived at the findings given below.

As oxidation methods, there is dry oxidation, which employs oxygen gas, and wet oxidation, which employs water vapor. In general, an oxide film formed by wet oxidation is higher in film quality than an oxide film formed by dry oxidation. Accordingly, in consideration of film properties, such as breakdown voltage, corrosion resistance, and reliability, a wet oxide film is better as an insulating film. On the other hand, the film-formation rate of an oxide film (insulating film) to be formed and the planar uniformity therein on a wafer are also important factors. In this respect, a film formed by wet oxidation under a normal pressure shows a high oxidation rate, but shows poor planar uniformity in film thickness, in general. By contrast, a film formed by wet oxidation under a vacuum pressure shows a low oxidation rate, but shows good planar uniformity in film thickness.

Where the design rule of semiconductor devices or semiconductor integrated circuits is not so strict, various oxidation methods as those described above are selectively used, in consideration of, e.g., the intended purpose of oxide films, process conditions, and apparatus cost. On the other hand, in recent years, the line width and film thickness of semiconductor devices have decreased, and thus the design rule has become stricter. This tendency has given rise to demands on better planar uniformity in the quality and thickness of oxide films. However, conventional oxidation methods are now becoming inadequate as regards. Particularly, using conventional oxidation methods, it is very difficult to form a thin film having a film thickness of, e.g., 2 nm or less, with good controllability in the film thickness.

In the case of the method disclosed in the patent publication 3, hydrogen and oxygen are made to react with each other by a catalyst at a low temperature to generate water vapor. The catalyst, such as platinum, is expensive, and considerably increases the cost of the entire apparatus.

Under the circumstances, the present inventors have found that, when oxidation is performed while supplying hydrogen and oxygen into a process container, if the process pressure is set to be higher than a certain value, the oxidation species dedicated to oxidation changes from activated species of hydrogen and oxygen to water vapor. In this case, it is possible to form a thin film having a film thickness of, e.g., about 2 nm, with improved controllability in the film thickness. It is also possible to maintain good values of planar uniformity and inter-surface uniformity in the film thickness.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a sectional view schematically showing a vertical heat-processing apparatus according to an embodiment of the present invention. As shown in FIG. 1, this vertical heat-processing apparatus 2 has a process container 4 made of quartz and shaped as cylindrical column with a ceiling. The bottom of the process container 4 is opened to form a port 6 with a flange 8 formed around it for connection. The process container 4 is surrounded by a cylindrical heat insulator 12, which is provided with a heater 10 or heating means disposed on the inner side, thereby constituting a furnace.

A hydrogen feed nozzle 14 for supplying hydrogen and an oxygen feed nozzle 16 for supplying oxygen are disposed to penetrate a lower portion of the sidewall of the process container 4. The nozzles 14 and 16 extend along the inner surface of the sidewall of the process container 4 to the ceiling, so as to spout gases therefrom at flow rates controlled as needed. A nitrogen feed nozzle 17 is also connected to the process container 4, for supplying nitrogen gas therefrom at a flow rate controlled as needed. The nozzles 14, 16, and 17 are connected to a gas supply section 13.

An exhaust port 18 having a relatively large diameter is formed in a lower portion of the sidewall of the process container 4, and is connected to an exhaust section 19 including an exhaust pump or the like. The exhaust section 19 exhausts the atmosphere inside the process container 4 to set the interior thereof at a predetermined vacuum level.

A base plate 20 made of, e.g., stainless steel is disposed to support the outer portion of the flange 8 of the process container 4, so as to support the entirety of the process container 4. The port 6 at the bottom of the process container 4 is opened and closed by a cap 24, which is made of quartz or stainless steel and moved up and down by an elevating mechanism 22, such as a boat elevator. A quartz support boat 26 is placed on the cap 24 through a cylindrical mount 28. The support boat 26 supports semiconductor substrates (target substrates), such as silicon wafers W, at predetermined regular intervals in the vertical direction. The support boat 26 is loaded into and unloaded from the process container 4 by moving the cap 24 up and down. The support boat 26 may be rotated or not rotated.

The entire operation of the vertical heat-processing apparatus 2 is controlled in accordance with a program preset in a control section CONT. Under the control of the control section CONT, a predetermined process is performed in the heat-processing apparatus 2, for example, as follows.

First, semiconductor substrates W are transferred onto the support boat 26 in an unload state where the elevating mechanism 22 is placed at a lower position. For example, the support boat 26 is designed to stack 50 to 100 8-inch wafers with a gap therebetween. Then, the cap 24 is moved up along with the support boat 26 by the elevating mechanism 22 to load the support boat 26 through the bottom port 6 into the process container 4. Then, the bottom port 6 of the process container 4 is airtightly closed by the cap 24 to hermetically seal the process container 4.

Then, the temperature of the heater 10 is raised to heat the semiconductor substrates W to a predetermined process temperature. Also, while the interior of the process container 4 is exhausted, a necessary process gas, such as hydrogen gas or oxygen gas, is supplied at a flow rate controlled as needed. By doing so, a predetermined heat process is performed while the process pressure in the process container 4 is kept at a predetermined pressure. In this heat-processing apparatus 2, the surface of the semiconductor substrates (silicon wafers) W is oxidized to form an oxide film of a semiconductor material (silicon). At this time, nitrogen gas may be supplied into the process container 4.

The process pressure in the process container 4 is set at 2000 Pa (15 Torr) or more. Under these conditions, hydrogen and oxygen supplied into the process container 1 cause a combustion reaction and thereby generate water vapor. The water vapor acts as an oxidation species and oxidizes the surface of the semiconductor substrates W, thereby forming an oxide ($SiO_2$) film thereon. In this case, not only planar uniformity in film thickness, but also inter-surface uniformity (uniformity in film thickness between the wafers arrayed on the support boat 26 in the vertical direction) can be maintained better, as compared to a case (conventional method) where the activated species of hydrogen and oxygen are used as they are.

Furthermore, the planar and inter-surface uniformity in film thickness can be also maintained good even at a region where the film-formation rate is low. Accordingly, this method is suitable for formation of a thin film having a film thickness of 2 nm or less, which is likely to be needed in the near future. In other words, it is possible to oxidize a number of semiconductor substrates to have good planar uniformity and good inter-surface uniformity both in film thickness, with high controllability in the film thickness.

The upper limit of the process pressure is set at about 10130 Pa (76 Torr), which is determined to prevent hydrogen and oxygen from explosively and abruptly reacting with each other. The process temperature is set to be within a range of, e.g., from about 600 to 1000° C. Where a thin film of 2 nm or less is formed, the process temperature is preferably set to be within a range of, e.g., from about 600 to 850° C., so as to suppress the film-formation rate and improve the film thickness controllability. The thin film controllability is improved at a process temperature of from about 600 to 850° C., because the film-formation temperature is lower, as shown in an Arrenius plot graph described later.

Where the process container 4 can accommodate about 100 8-inch wafers, the process container 4 has a volume of about 100 liters. In this case, the total gas flow rate of hydrogen and oxygen is preferably set to be within a range of from about 0.2 liters/min to 1 liter/min, in light of planar uniformity in film thickness. The ratio of the flow rate of hydrogen relative to the total gas flow rate of hydrogen and oxygen is preferably set to be within a range of from 10 to 50%, in light of planar uniformity in film thickness.

[Experiment 1]

Next, an explanation will be given of an experiment 1, which compared a method according to the embodiment with a conventional method. In the experiment 1, silicon wafers were oxidized under the following process conditions. Specifically, the process temperature was set at 900° C., $H_2/O_2$ gas ratio at 0.9/1.8 slm (liter/min) [$H_2$ concentration: 33.3%], and oxidation time at 20 minutes. The process pressure was set at different values within a range of from 0.25 Torr (33 Pa) to 76 Torr (10130 Pa).

Figure 2:
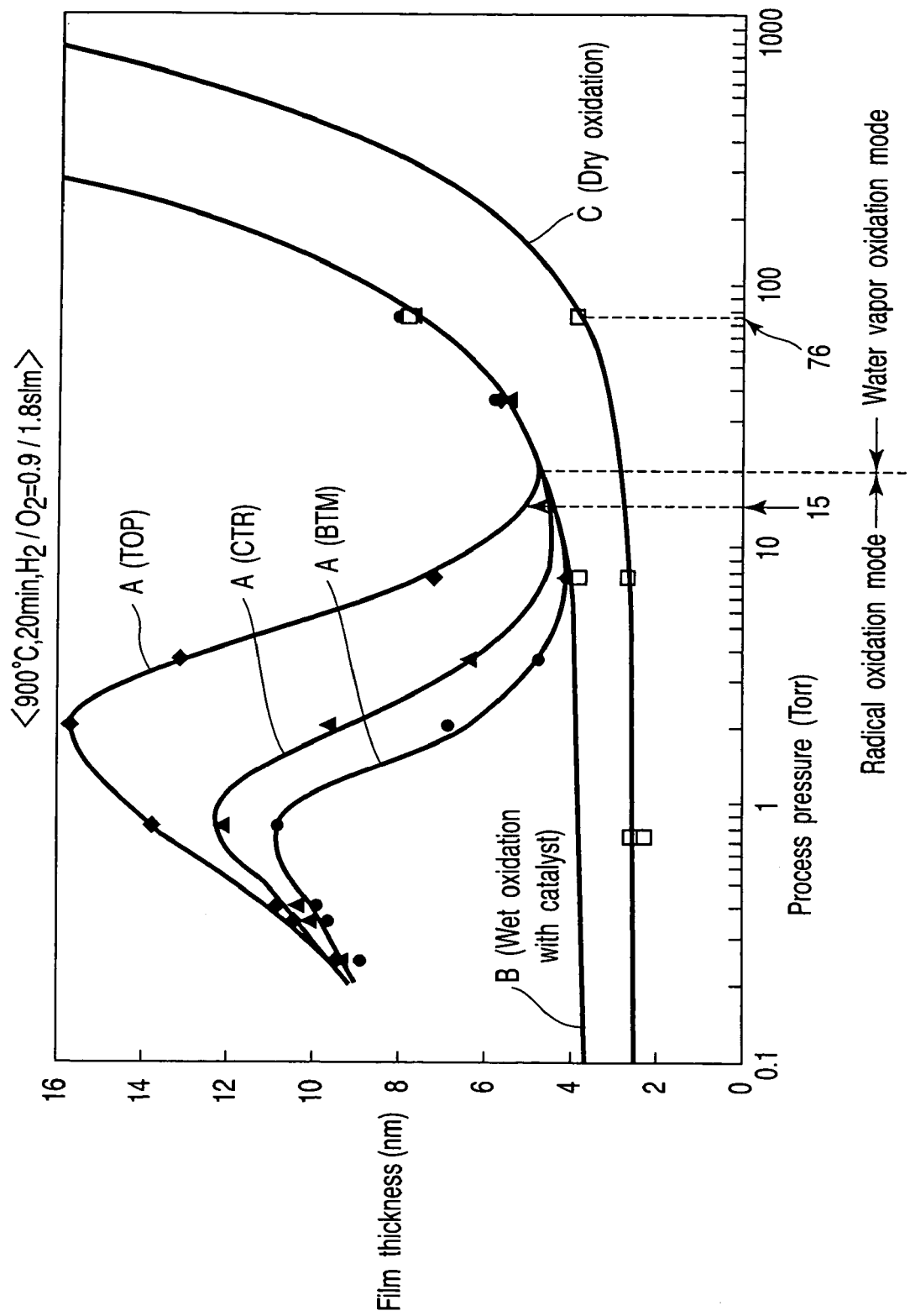
FIG. 2 is a graph showing the relationship between oxidation process pressure and film thickness, obtained by an experiment 1.

FIG. 2 is a graph showing the relationship between oxidation process pressure and film thickness, obtained by the experiment 1. In FIG. 2, curves A show the characteristics of the method of the embodiment. A curve B shows the characteristic of a first comparative example (a conventional method: wet oxidation in which hydrogen and oxygen were made to react with each other by a catalyst to generate water vapor). A curve C shows the characteristic of a second comparative example (a conventional method: dry oxidation). In FIG. 2, the symbol "TOP" stands for a semiconductor substrate at the top portion of the support boat. The symbol "CTR" stands for a semiconductor substrate at the central portion of the support boat. The symbol "BTM" stands for a semiconductor substrate at the bottom portion of the support boat.

As shown in FIG. 2, in the case of the curves A obtained by the method of the embodiment (hydrogen and oxygen were directly supplied into the process container 4), the following changes were observed.

Specifically, when the process pressure was near a range of from 0.25 Torr to 1 Torr, activated species of hydrogen and oxygen acted as oxidation species, whereby the reactivity increased and thus the film thickness increased, with increase in the pressure. When the process pressure was within a range of from 1 Torr to 20 Torr, so called deactivation, in which the activated species lost activity, was dominant, whereby the reactivity decreased and thus the film thickness gradually decreased to the lowest value, with increase in the pressure. In other words, the oxidation mode within a range of from 0.25 to 20 Torr was an activated species oxidation mode. This activated species oxidation mode was unfavorable, because the difference in film thickness between "TOP", "CTR", and "BTM" was very large, and the inter-surface uniformity in film thickness was very poor, except for conditions near 0.25 Torr and near 20 Torr. It is thought that this large difference in film thickness between the "TOP", "CTR", and "BTM" was due to a phenomenon in which the degree of generation and extinction (deactivation) of activated species greatly differed, depending on the wafer position.

Furthermore, in the case of the curves A, the film thickness shifted into increase when the process pressure was near 20 Torr (2666 Pa), and then the film thickness rapidly increased with increase in the pressure. When the process pressure was 20 Torr or more, the difference in film thickness between "TOP", "CTR", and "BTM" was almost zero, and inter-surface uniformity in film thickness was very favorable. The reason for this is thought to be that, at every area within the process container 4 in the vertical direction, the oxidation mode changed when the process pressure was near 20 Torr, from the activated species oxidation mode into a water vapor oxidation mode in which water vapor acted for oxidation.

Accordingly, it has been found that the process pressure is preferably set at 15 Torr (2000 Pa) or more, and more preferably at 20 Torr (2666 Pa) or more. A range of the process pressure is determined in light of permissible values of inter-surface uniformity in film thickness, such that film-formation rate (film thickness) is very low, and inter-surface uniformity in film thickness is good. For example, where the process pressure is set at 20 Torr (2666 Pa), the inter-surface uniformity in film thickness becomes almost zero.

It is thus preferable to supply hydrogen and oxygen into the process container 4, while setting the process pressure at a value within the range described above, so as to perform oxidation for forming an oxide film. As a consequence, a very thin oxide film having a film thickness of, e.g., about 2 nm can be formed with good controllability in the film thickness. In this case, as described above, the upper limit of the process pressure is about 75 Torr (10130 Pa), in light of safety of a mixed gas of hydrogen and oxygen. As shown in FIG. 2, the curves A showed good inter-surface uniformity in film thickness when the process pressure was 0.25 Torr, but with film-formation rates (film thickness) being too high. This condition is not favorable, because it is difficult to obtain good controllability in film thickness, for an oxide film of about 2 nm.

On the other hand, in the case of the curve B obtained by a method according to the first comparative example (a conventional method: wet oxidation in which hydrogen and oxygen were made to react with each other by a catalyst to generate water vapor, over the entire pressure range), the film-formation rate (film thickness) was low from the beginning. The curve B took on the same value as the curves A when the process pressure was near 15 to 20 Torr, and then increased. This method is suitable for formation of a thin film with good controllability in film thickness. However, as described above, this method requires a catalyst, such as platinum, and unfavorably increases the cost of the entire apparatus.

In the case of the curve C obtained by a method according to the second comparative example (conventional method: dry oxidation), the film-formation rate (film thickness) was low. However, as described above, this method unfavorably deteriorates the film quality of an oxide film to be formed.

[Experiment 2]

Next, an explanation will be given of an experiment 2, which examined the dependency of the method of the embodiment upon temperature. In the experiment 2, silicon wafers were oxidized under the following process conditions. Specifically, the $H_2/O_2$ gas ratio was set at 0.9/1.8 slm (liter/min), and oxidation time at 20 minutes. The process temperature was set at different values within a range of from 600 to 1000° C.

Figure 3:
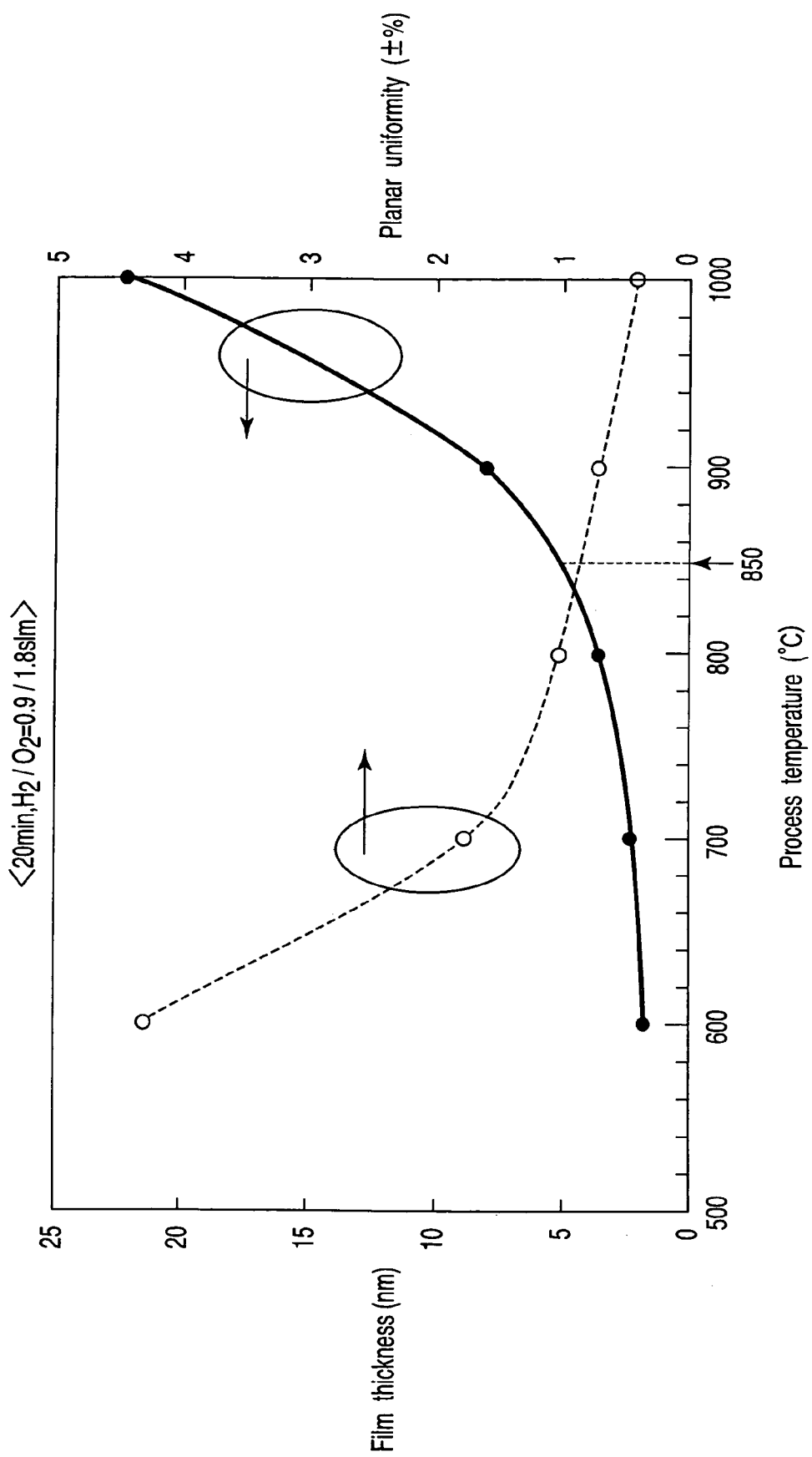
FIG. 3 is a graph showing the relationship between process temperature, and film thickness and planar uniformity in the film thickness, obtained by an experiment 2.

FIG. 3 is a graph showing the relationship between process temperature, and film thickness and planar uniformity in the film thickness, obtained by an experiment 2. FIG. 4 is a graph showing an Arrenius plot for obtaining activation energy from the result shown in FIG. 3. In FIG. 4, the horizontal axis denotes "the reciprocal of absolute temperature×1000", along with temperature (° C.). FIG. 4 includes the characteristic of a normal pressure water vapor oxidation mode for reference.

As shown in FIG. 3, an oxide film was formed at any temperature within a range of from 600 to 1000° C. With increase in process temperature, the film thickness (film-formation rate) gradually increased. In order to form a thin film having a film thickness of about 2 nm with good controllability in the film thickness, it is preferable to set the process temperature at 850° C. or less, at which the film thickness is 5 nm (film-formation rate: 0.25 nm/min) or less. In light of planar uniformity in film thickness, it is preferable to set the process temperature at 800° C. or more, at which the planar uniformity is within ±1%. Accordingly, it has been found that, where the process temperature is set to be within a range of from 800 to 850° C., a thin oxide film is formed with very good controllability in film thickness.

Next, let's focus on activation energy with reference to the Arrenius plot graph shown in FIG. 4. In FIG. 4, the degree of inclination of graph lines represents the activation energy. In this method of the embodiment of the present invention, the activation energy is large at a process temperature of 850° C. or more, and is small at a process temperature of 850° C. or less. In the method of the embodiment, the activation energy at a process temperature of 850° C. or more is almost the same as the activation energy of the normal pressure water vapor oxidation mode (characteristic lines are almost parallel). It has been found that the process temperature is preferably set at 850° C. or less, at which the activation energy is small, because a smaller activation energy contributes to better controllability of a thin film.

[Experiment 3]

Next, an explanation will be given of an experiment 3, which examined the dependency of the method of the embodiment upon the total gas flow rate of hydrogen and oxygen. In the experiment 3, silicon wafers were oxidized under the following process conditions. Specifically, the process pressure was set at 76 Torr, the process temperature at 900° C., the hydrogen/oxygen gas ratio at 1/2, and oxidation time at 20 minutes. The total gas flow rate of hydrogen and oxygen was set at different values within a range of from 0.2 liters/min to 2.7 liters/min, while maintaining the gas ratio described above. The process container 4 had a volume of about 100 liters.

FIG. 5 is a graph showing the relationship between the total gas flow rate of hydrogen and oxygen, and film thickness and planar uniformity in the film thickness, obtained by an experiment 3. As shown in FIG. 5, with increase in the total gas flow rate of $H_2+O_2$, the film thickness (film-formation rate) gradually increased. When the total gas flow rate reached about 1 liter, increase in the film thickness (film-formation rate) was saturated. With increase in the total gas flow rate, the difference in film thickness between "TOP", "CTR", and "BTM" gradually increased, and was saturated when the total gas flow rate reached about 1 liter. On the other hand, the planar uniformity showed essentially no dependency upon the total gas flow rate, and maintained good values of about ±1% or less, without reference to the wafer position.

Accordingly, it has been found that the total gas flow rate of $H_2+O_2$ is preferably set at 1 liter/min or less, where oxidation is performed within the process container 4 that can accommodate about 100 8-inch wafers (the volume is about 100 liters). By doing so, it is possible to form a thin film at a low film-formation rate and with good controllability in film thickness, and further to maintain good planar uniformity and inter-surface uniformity in the film thickness.

[Experiment 4]

Next, an explanation will be given of an experiment 4, which examined the dependency of the method of the embodiment upon hydrogen concentration. In the experiment 4, silicon wafers were oxidized under the following process conditions. Specifically, the process pressure was set at 76 Torr, the process temperature at 900° C., the total gas amount of hydrogen and oxygen at a constant value of 2.7 liters/min, and oxidation time at 20 minutes. The total gas flow rate of hydrogen and oxygen was set at different values within a range of from 0.2 liters/min to 2.7 liters/min, while maintaining the gas ratio described above. The hydrogen concentration was set at different values within a range of from 10 to 70%. The hydrogen concentration was defined to be the ratio of the flow rate of hydrogen relative to the total gas flow rate of hydrogen and oxygen, i.e., $(H_2/[H_2+O_2])$.

Figure 6:
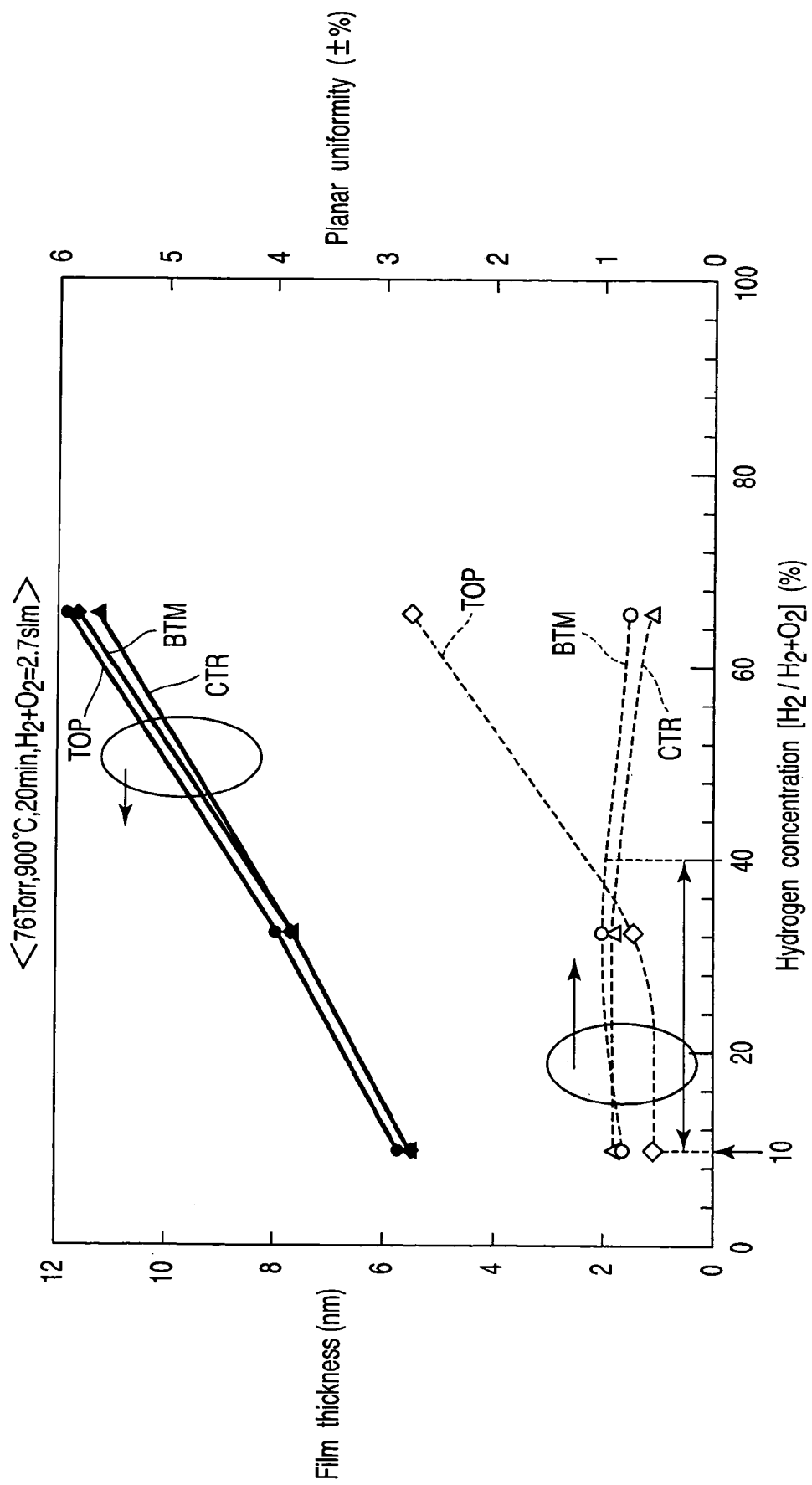
FIG. 6 is a graph showing the relationship between hydrogen concentration, and film thickness and planar uniformity in the film thickness, obtained by an experiment 4.

FIG. 6 is a graph showing the relationship between hydrogen concentration, and film thickness and planar uniformity in the film thickness, obtained by an experiment 4.

As shown in FIG. 6, the film thickness almost linearly increased with increase in the hydrogen concentration. Over the entire range of this increase, the difference in film thickness between "TOP", "CTR", and "BTM" was very small, i.e., showed good values. On the other hand, the planar uniformity in film thickness showed good values of about ±1% or less, when the hydrogen concentration was within a range of from 10 to 40%.

Accordingly, it has been found that the hydrogen concentration is preferably set to be within a range of from 10 to 40%. By doing so, it is possible to form a thin oxide film having a film thickness of 2 nm or less with good controllability in film thickness, and further to maintain good inter-surface uniformity and planar uniformity in the film thickness.

[Experiment 5]

Next, an explanation will be given of an experiment 5, which examined the dependency of the method of the embodiment upon hydrogen concentration, using conditions different from those of the experiment 4. In the experiment 5, silicon wafers were oxidized under the following process conditions. Specifically, the process pressure was set at 40 Torr, the process temperature at 800° C., the total gas amount of hydrogen and oxygen at a constant value of 0.5 liters/min, and oxidation time at 3 minutes. The hydrogen concentration was set at different values within a range of from 10 to 90%. The hydrogen concentration was defined to be the ratio of the flow rate of hydrogen relative to the total gas flow rate of hydrogen and oxygen, i.e., ($H_2$/[$H_2$+$O_2$]).

Figure 7:
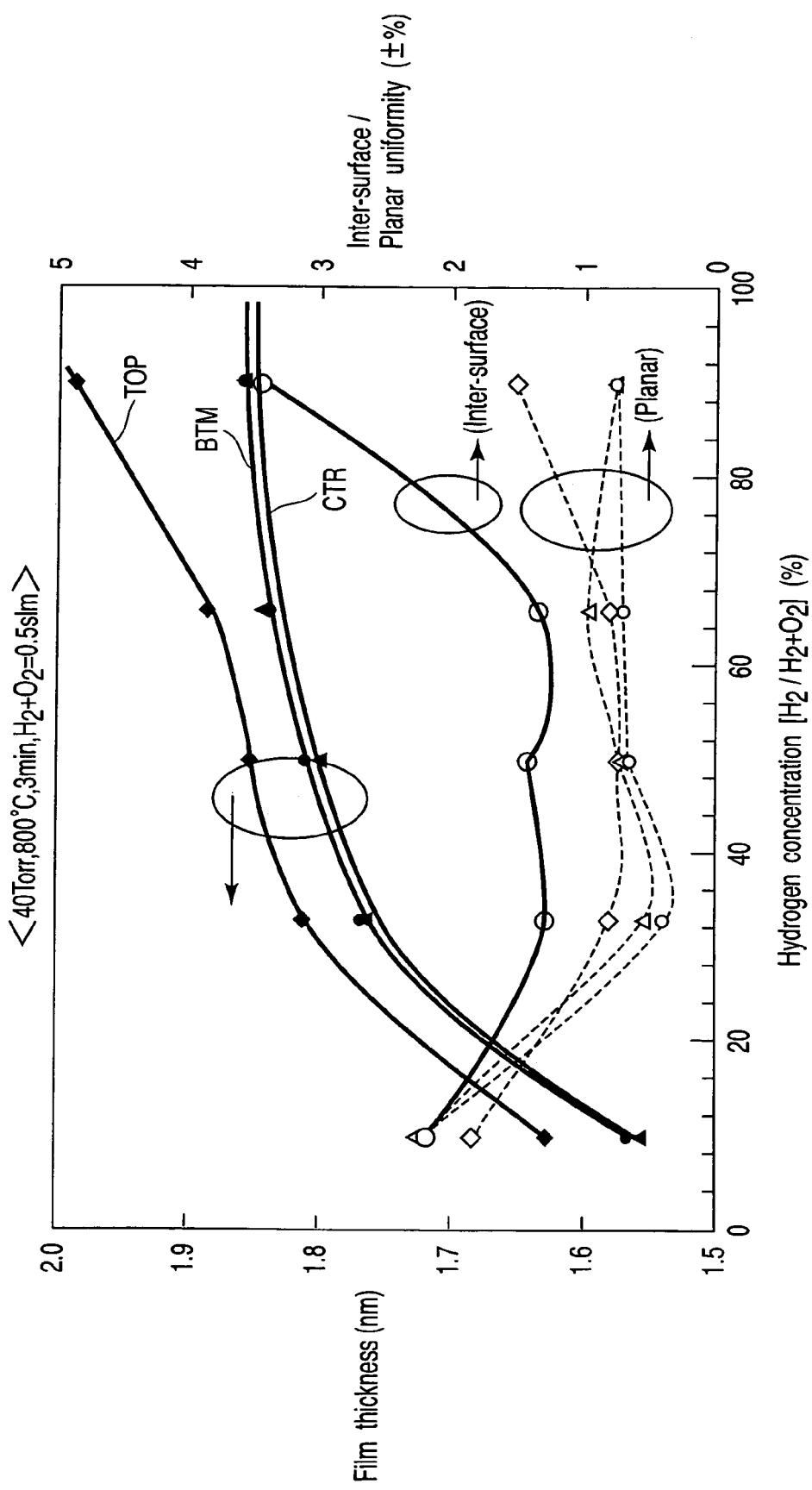
FIG. 7 is a graph showing the relationship between hydrogen concentration, and film thickness and inter-surface/planar uniformity in the film thickness, obtained by an experiment 5.

FIG. 7 is a graph showing the relationship between hydrogen concentration, and film thickness and inter-surface/planar uniformity in the film thickness, obtained by an experiment 5. As shown in FIG. 7, the film thickness almost linearly increased at first and was then the increase saturated halfway, with increase in the hydrogen concentration. The film thickness on the "TOP" wafer was thicker over the entire range, and rapidly increased when the hydrogen concentration was 66% or more. The inter-surface uniformity in film thickness was unfavorably relatively large when the hydrogen concentration was within a range of from 10 to 20% and a range of from 70 to 80%. The inter-surface uniformity was as small as 1.5% or less when the hydrogen concentration was within a range of from 20 to 70%. The planar uniformity in film thickness was unfavorably larger than ±1% when the hydrogen concentration was within a range of from 10 to 33% and a range of from 80 to 90%. The planar uniformity was as good as ±1% or less, when the hydrogen concentration was within a range of from 33 to 80%.

Accordingly, it has been found that the hydrogen concentration is preferably set to be within a range of from 33 to 70% at a process temperature of 800° C. By doing so, it is possible to form a thin oxide film having a film thickness of 2 nm or less with good controllability in film thickness, and further to maintain good inter-surface uniformity and planar uniformity in the film thickness.

[Experiment 6]

Next, an explanation will be given of an experiment 6, which compared present examples PE1 and PE2 according to the method of the embodiment with comparative examples CE11, CE12, CE21, and CE22 according to a conventional method. In the present example PE1, a thinner silicon oxide film was formed at a target film thickness of about 2 nm. In the present example PE2, a thicker silicon oxide film was formed at a target film thickness of about 8 nm. The terms "thinner film" and "thicker film" are used only for comparison of the two films, and are not intended to define any absolute value of film thickness.

In the present example PE1, silicon wafers were oxidized under the following process conditions. Specifically, the process pressure was set at 40 Torr, the process temperature at 800° C., the flow rates of $H_2/O_2/N_2$ at 0.1/0.1/0.5 liters/min, and oxidation time at 3 minutes.

In the comparative example CE11, the process conditions were set to be the same as the present example PE1, except that wet oxidation (conventional method) was employed in which hydrogen and oxygen were made to react with each other by a catalyst to generate water vapor. In the CE12, the process conditions were set to be the same as the present example PE1, except that dry oxidation (conventional method) was employed in which the flow rates of $O_2/N_2$ were set at 0.1/0.6 liters/min, without hydrogen as a process gas.

In the present example PE2, silicon wafers were oxidized under the following process conditions. Specifically, the process pressure was set at 76 Torr, the process temperature at 900° C., the flow rates of $H_2/O_2$ at 0.9/1.8 liters/min, and oxidation time at 20 minutes.

In the comparative example CE21, the process conditions were set to be the same as the present example PE2, except that wet oxidation (conventional method) was employed in which hydrogen and oxygen were made to react with each other by a catalyst to generate water vapor. In the CE22, the process conditions were set to be the same as the present example PE2, except that dry oxidation (conventional method) was employed in which the flow rates Of $O_2/N_2$ were set at 1.8/0.9 liters/min, without hydrogen as a process gas.

Figure 8:
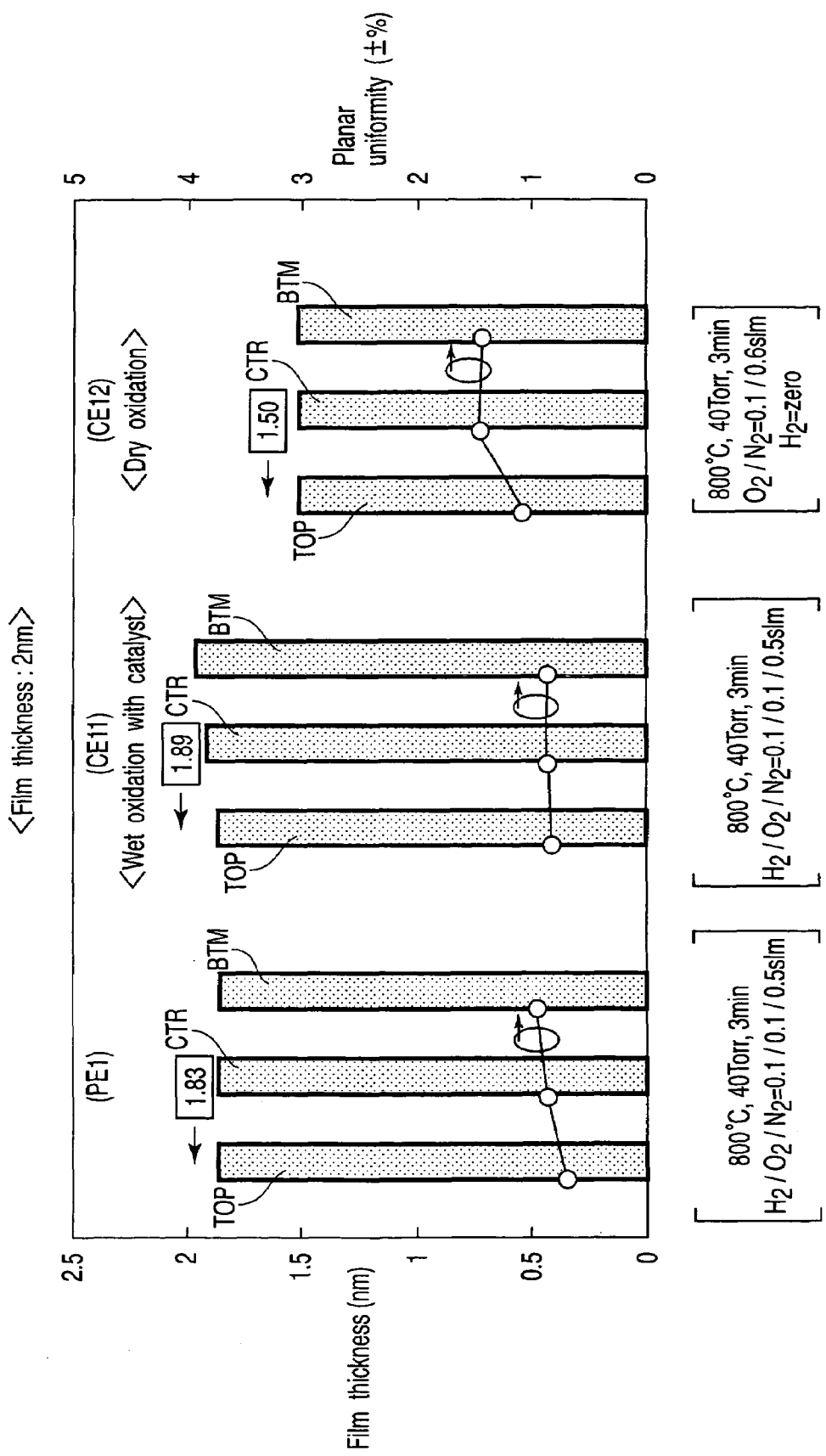
FIG. 8 is a graph showing the film thickness and planar uniformity of a present example PE1, and comparative examples CE11 and CE12, obtained by an experiment 6.

FIG. 8 is a graph showing the film thickness and planar uniformity of the present example PE1, and comparative examples CE11 and CE12, obtained by an experiment 6. FIG. 9 is a graph showing the film thickness and planar uniformity of the present example PE2, and comparative examples CE21 and CE22, obtained by the experiment 6. FIGS. 8 and 9 show values of the film thickness at "TOP", "CTR", and "BTM", and the average values thereof and the planar uniformity therein.

As shown in FIGS. 8 and 9, the present examples PE1 and PE2 took on values similar to those of the comparative examples CE11 and CE21, in terms of both the planar uniformity and inter-surface uniformity in film thickness. Accordingly, it has been confirmed that the method of the embodiment can provide results almost the same as the conventional method using an expensive catalyst. The comparative examples CE12 and CE22 employing dry oxidation took on good values of the planar uniformity in film thickness. As described above, however, dry oxidation is unfavorably poor in film quality.

The present invention is not limited to the heat-processing apparatus shown in FIG. 1, and it may be applied to, e.g., a heat-processing apparatus in which hydrogen and oxygen are supplied from the bottom of a process container and exhausted from the top thereof. Furthermore, in the description, the method of the embodiment is performed in the heat-processing apparatus of the batch type. Alternatively, the present invention may be applied to a heat-processing apparatus of the so-called single-substrate type in which semiconductor substrates are processed one by one.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for oxidizing a surface of a plurality of target substrates together, the substrates being stacked at intervals in a vertical direction, the method comprising:
    heating a process container that accommodates the target substrate; supplying hydrogen gas and oxygen gas into the process container while exhausting the process container;
    causing the hydrogen gas and the oxygen gas to react with each other in the process container at a process temperature and a process pressure of a water vapor oxidation mode to generate water vapor, the process pressure being set to be within a range of from 2666 Pa (20 Torr) to 10130 Pa (76 Torr); and
    oxidizing the surface of the target substrate by the water vapor in the water vapor oxidation mode;
    wherein the surface of the target substrate comprises a semiconductor surface.

2. The method according to claim 1, wherein the process temperature is set to be within a range of from 600 to 1000° C.

3. The method according to claim 2, wherein the process temperature is set to be within a range of 800 to 850° C.

4. The method according to claim 1, wherein a total flow rate of the hydrogen gas and the oxygen gas is set at 1 liter/mm or less.

5. The method according to claim 1, wherein a ratio of a flow rate of the hydrogen gas relative to a total flow rate of the hydrogen gas and the oxygen gas is set to be within a range of 10 to 40%.

6. The method according to claim 1, wherein the semiconductor surface is a silicon surface.

7. A method for oxidizing a silicon layer on a surface of a plurality of target substrates together to form a silicon oxide film, the substrates being stacked at intervals in a vertical direction, the method comprising:
    heating a process container that accommodates the target substrate;
    supplying hydrogen gas and oxygen gas into the process container from an upper side while exhausting the process container from a lower side;
    causing the hydrogen gas and the oxygen gas to react with each other in the process container at a process temperature and a process pressure of a water vapor oxidation mode to generate water vapor, the process temperature being set to be within a range of from 600 to 1000° C., and the process pressure being set to be within a range of from 2666 Pa (20 Toni) to 10130 Pa (76 Torr); and
    oxidizing the silicon layer by the water vapor to form the silicon oxide film in the water vapor oxidation mode.

8. The method according to claim 7, wherein the process temperature is set to be within a range of from 800 to 850° C.

9. The method according to claim 7, wherein a total flow rate of the hydrogen gas and the oxygen gas is set at [1/100 of process container volume]/min or less, and a ratio of a flow rate of the hydrogen gas and the oxygen gas is set to be within a range of 10 to 40%.

10. The method according to claim 9, wherein substantially only the hydrogen gas and the oxygen gas, or substantially only the hydrogen gas, the oxygen gas, and nitrogen gas are supplied into the process container to generate the water vapor.

11. The method according to claim 1, wherein the method comprises supplying hydrogen gas and oxygen gas into the process container from an upper side while exhausting the process container from a lower side.

* * * * *